US012506452B2

(12) United States Patent
Rivas-Davila et al.

(10) Patent No.: US 12,506,452 B2
(45) Date of Patent: Dec. 23, 2025

(54) APPARATUSES AND METHODS INVOLVING AMPLIFICATION CIRCUIT WITH PUSH-PULL WAVESHAPING OPERATION

(71) Applicant: The Board of Trustees of the Leland Stanford Junior University, Stanford, CA (US)

(72) Inventors: Juan Rivas-Davila, Palo Alto, CA (US); Lei Gu, Stanford, CA (US); Tuofei Chen, Stanford, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 544 days.

(21) Appl. No.: 17/908,508

(22) PCT Filed: Mar. 12, 2021

(86) PCT No.: PCT/US2021/022151
§ 371 (c)(1),
(2) Date: Aug. 31, 2022

(87) PCT Pub. No.: WO2021/183915
PCT Pub. Date: Sep. 16, 2021

(65) Prior Publication Data
US 2023/0122538 A1 Apr. 20, 2023

Related U.S. Application Data

(60) Provisional application No. 62/988,745, filed on Mar. 12, 2020.

(51) Int. Cl.
*H03F 3/217* (2006.01)
*H03F 1/56* (2006.01)

(52) U.S. Cl.
CPC ............. *H03F 3/2176* (2013.01); *H03F 1/56* (2013.01)

(58) Field of Classification Search
CPC ...... H03F 3/2176; H03F 1/56; H02M 1/0043; H02M 7/493; H02M 1/12; H02M 1/15; H02M 1/44; H02M 7/4815; H02M 7/497
(Continued)

(56) References Cited

U.S. PATENT DOCUMENTS 10,020,747 B2 * 7/2018 Madsen ................. H02M 1/44
2008/0116972 A1   5/2008 McMorrow
(Continued)

FOREIGN PATENT DOCUMENTS

EP    0092219 A1    10/1983
WO   2011017802 A1   7/2011

OTHER PUBLICATIONS

USPTO. International Search Report and Written Opinion dated Jun. 30, 2021 for parent PCT Application No. PCT/US2021/022151, 11 pages.
(Continued)

*Primary Examiner* — Hieu P Nguyen
(74) *Attorney, Agent, or Firm* — Crawford Maunu PLLC

(57) ABSTRACT

In certain examples, methods and semiconductor structures are directed to circuit-based apparatus in which an amplifier includes stacked, first and second circuit amplification stages to operate out of phase from one another for providing a push-pull operation, with each of the first and second circuit stages including a switching circuit and an impedance path to drive the switching circuit. The apparatus further includes a waveform-shaping circuit to shape, in response to each of the first and second circuit stages, a voltage signal for presentation to the switching circuit. As may be implemented in various more-specific examples, the apparatus
(Continued)

may generate a constant output voltage with high efficiency across a wide range of resistive loads.

28 Claims, 13 Drawing Sheets

(58) Field of Classification Search
USPC .................................................. 330/251, 297
See application file for complete search history.

(56) References Cited

U.S. PATENT DOCUMENTS

| 2011/0051473 | A1 | 3/2011 | Glaser et al. |
|---|---|---|---|
| 2016/0173078 | A1 | 6/2016 | Shih et al. |
| 2017/0085183 | A1 | 3/2017 | Notsch |
| 2017/0085189 | A1 | 3/2017 | Madsen |
| 2019/0007004 | A1 | 1/2019 | Raymond et al. |

OTHER PUBLICATIONS

J. S. Glaser and J. M. Rivas, "A 500 W push-pull dc-dc power converter with a 30 MHz switching frequency," 2010 Twenty-Fifth Annual IEEE Applied Power Electronics Conference and Exposition (APEC), Palm Springs, CA, USA, 2010, pp. 654-661.

L. Gu, G. Zulauf, Z. Zhang, S. Chakraborty and J. Rivas-Davila, "Push-Pull Class Φ2 RF Power Amplifier," in IEEE Transactions on Power Electronics, vol. 35, No. 10, pp. 10515-10531, Oct. 2020. Examiner is referred to Appendix A of the underlying Provisional Application (U.S. Appl. No. 62/988,745), which includes this content.

Gu, K. Surakitbovorn, G. Zulauf, S. Chakraborty and J. Rivas-Davila, "High-Frequency Bidirectional Resonant Converter for High Conversion Ratio and Variable Load Operation," in IEEE Journal of Emerging and Selected Topics in Power Electronics, vol. 8, No. 3, pp. 1983-1993, Sep. 2020.

J. M. Rivas, Y. Han, O. Leitermann, A. Sagneri and D. J. Perreault, "A High-Frequency Resonant Inverter Topology with Low Voltage Stress," IEEE Transactions on Power Electronics, vol. 23, No. 4, pp. 1759-1771 (Jul. 2008).

R. Bosshard, J. W. Kolar, J. Mühlethaler, I. Stevanović, B. Wunsch and F. Canales, "Modeling and η-α-Pareto Optimization of Inductive Power Transfer Coils for Electric Vehicles," in IEEE Journal of Emerging and Selected Topics In Power Electronics, vol. 3, No. 1, pp. 50-64, Mar. 2015.

Hanson, Alex J., Julia A. Belk, Seungbum Lim, David J. Perreault, and Charles R. Sullivan. "Measurements and Performance Factor Comparisons of Magnetic Materials at High Frequency." 2015 Energy Conversion Congress and Exposition (Sep. 2015).

Y. Li, L. Gu, A. Hariya, Y. Ishizuka, J. Rivas-Davila and S. Sanders, "A Wide Input Range Isolated Stacked Resonant Switched-Capacitor dc-dc Converter for High Conversion Ratios," 2018 IEEE 19th Workshop on Control and Modeling for Power Electronics (COMPEL), Padua, Italy, 2018, pp. 1-7 (Abstract Only).

Gu, L., Liang, W., Praglin, M., Chakraborty, S., & Rivas-Davila, J. (2018). A wide-input-range high-efficiency step-down power factor correction converter using a variable frequency multiplier technique. IEEE Transactions on power electronics, 33(11), 9399-9411.

Gu, L., Liang, W., & Rivas-Davila, J. (2017, July). A multi-resonant gate driver for Very-High-Frequency (VHF) resonant converters. In 2017 IEEE 18th Workshop on Control and Modeling for Power Electronics (COMPEL) (pp. 1-7). IEEE.

Zulauf, G., Park, S., Liang, W., Surakitbovorn, K. N., & Rivas-Davila, J. (2018). Coss losses in 600 v gan power semiconductors in soft-switched, high-and very-high-frequency power converters. IEEE Transactions on Power Electronics, 33(12), 10748-10763.

K. Surakitbovorn and J. R. Davila, "Evaluation of GaN transistor losses at MHz frequencies in soft switching converters," 2017 IEEE 18th Workshop on Control and Modeling for Power Electronics (COMPEL), Stanford, CA, USA, 2017, pp. 1-6. Abstract Only.

Xu, J., Gu, L., Ye, Z., Kargarrazi, S., & Rivas-Davila, J. M. (2019). Cascode GaN/SiC: A wide-bandgap heterogenous power device for high-frequency applications. IEEE Transactions on Power Electronics, 35(6), 6340-6349.

The Examiner is respectfully referred to related, foreign national patent prosecution of the Applicant: European patent application No. 21768411.7; Japanese patent application No. 2022-554645; and Korean patent application No. 10-2022-7035249, each of which claiming priority to the parent PCT application. No attachments.

EPO. Extended European Search Report (EESR) dated Mar. 12, 2024, received for related counterpart European Patent Application No. 21768411.7,11 pgs. Applicant respectfully refers the Examiner to this copending foreign patent prosecution.

R. Peña-Eguiluz et al., "Stacked Class-E Amplifier," in IEEE Transactions on Industrial Electronics, vol. 67, No. 10, pp. 8292-8301, Oct. 2020.

Lei Gu et al. "High-Frequency Resonant Converter with Synchronous Rectification for High Conversion Ratio and Variable Load Operation." 2018 International Power Electronics Conference (IPEC-Niigata 2018—ECCE Asia), pp. 632-638, May 2018.

* cited by examiner

APPARATUSES AND METHODS INVOLVING AMPLIFICATION CIRCUIT WITH PUSH-PULL WAVESHAPING OPERATION

BACKGROUND

Aspects of the present disclosure are related generally to the field of power conversion involving high efficiencies, and as may be exemplified using switching devices that are turned on and off at high frequencies.

Power amplifiers often play important roles in many systems and devices throughout our modern infrastructure, ranging from cellphones and radio towers to medical equipment like Magnetic Resonance Imaging (MRI) and particle accelerators for scientific research purposes. Switched-mode power amplifiers can ideally offer close-to-unity efficiency, which makes them attractive for energy-hungry radio-frequency and microwave applications. By operating the active device as a switch rather than a controlled current source, the overlap between the voltage and current can be mitigated to reduce frequency-dependent switching losses.

Previous efforts have studied the design of many types of switched-mode power amplifiers. For example, in one type of amplifier known as Class E, the voltage across the active device resonantly rings down to zero before the active device is switched on. Such zero-voltage switching (ZVS) operation avoids the loss of the energy stored in the parasitic capacitance across the main junction of the active device. Besides ZVS operation in a Class E circuit, the current flowing through the active device is zero when it is switched on, which causes the rate of the voltage change across the parasitic capacitance also to be zero. This is call zero voltage derivative switching (ZVDS) operation. Despite the high theoretical efficiency, one of the draw backs of a Class E amplifier is that the peak voltage across the switch equals about 3.6 times of the dc input. Another type, referred to as a Class F amplifier, uses multiple-resonator output filters to control the harmonic content of their drain-voltage and/or drain-current waveforms. In a voltage-mode Class F amplifier, the impedance across the switch Q is tuned to be open at every odd harmonic frequency except for the fundamental, and to be short at all of the even harmonic frequencies. With such impedance tuning, the drain voltage in a voltage-mode Class F is a square wave, while the drain current is ideally a half sine wave. Maximally flat voltage-mode Class F has a peak voltage that is two times the DC voltage input on the switch. Class F type amplifiers have more desirable switch waveforms, but the output capacitance of transistors used in such amplifiers limits the open-impedance tuning at high frequencies. The operations of Class E and Class F (F-1) type amplifiers have been combined as a Class E/F family of ZVS switching amplifiers (e.g., including Class EF2 or Φ2 converters) to realize certain benefits in terms of high voltage and high-frequency power conversion with high efficiency, reduced device voltage stress, simplicity of gate driving and/or load-independent ZVS operation: however, previous designs of these types have certain shortfalls and therefore are subject to fundamental improvements in terms of design topology, operating characteristics and/or overall performance.

Accordingly, aspects of the present disclosure are directed to addressing the above and other attributes of such amplifiers.

SUMMARY OF VARIOUS ASPECTS AND EXAMPLES

Various examples/embodiments presented by the present disclosure are directed to issues such as those addressed above and others which may become apparent from the following disclosure. For example, some of these disclosed aspects are directed to methods and devices that use or leverage from push-pull fast-switching amplifier technology but using a type of design having attributes such as being easily implemented, experiencing significantly-reduced voltage stress due to relatively low peak-switch voltages (e.g., twenty-fifty percent reductions and in certain with peak switch voltage reduced to 1.1 VDC), experiencing resistive-load independent ZVS operation, and/or reducing the filtering for input ripple currents. Other aspects and examples are directed to maintaining one or more of the above attributes and also operating in a manner that reduces the conversion circuitry's circulating energy while improving the achievable drain efficiencies.

In one specific example according to the present disclosure, a method involves a method and/or a semiconductor device having multiple signal-amplification circuit stages and a waveform-shaping circuit shaping circuit. Among the signal-amplification circuit stages are first and second signal-amplification circuit stages which operate out of phase from one another and using a push-pull action, with the first and second signal-amplification circuit stages including respective first and second switching circuits. The waveform-shaping circuit shapes, in response to each of the first and second circuit stages, a voltage signal for presentation to the first and second switching circuits.

In one specific example which relates to the above-characterized example, the waveform-shaping circuit may be implemented with circuitry along a circuit path having end nodes respectively connected to shunt-tuning legs in the first and second circuit stages to provide an effective block of DC current flowing through the circuit path.

In another specific example also relating to the above-characterized example, the first and second circuit stages are stacked relative to one another and the waveform-shaping circuit is connected to the first and second circuit stages to effect a short circuit therebetween at high frequencies which are associated with harmonics caused by operation of the first and second circuit stages.

In yet other specific examples which relate to the above-characterized examples, each of the first and second circuit stages may include an impedance path having a switch-driving branch to present current to the switching circuit of each of the first and second circuit stages and having another branch to couple energy to another of the first and second circuit stages via the waveform-shaping circuit; and an output port to couple to a load circuit.

Further in a more specific example, the output port of the first circuit stage may be coupled to the first switching circuit via a first LC-based circuit, and the output port of the second circuit stage may be coupled to the second switching circuit via a second LC-based circuit which complements the first LC-based impedance circuit. Also, the first LC-based circuit and the second LC-based circuit may couple to the load circuit to form a series RLC-based circuit, wherein the load circuit shares in a resistance contribution to the RLC-based circuit that is dominated by the load circuit.

The above discussion is not intended to describe each aspect, embodiment or every implementation of the present disclosure. The following figures and detailed description of various embodiments are also intended for exemplification purposes.

BRIEF DESCRIPTION OF FIGURES

Various example embodiments, including experimental examples, may be more completely understood in consideration of the following detailed description in connection with the accompanying drawings, each in accordance with the present disclosure, in which.

Figure 1:
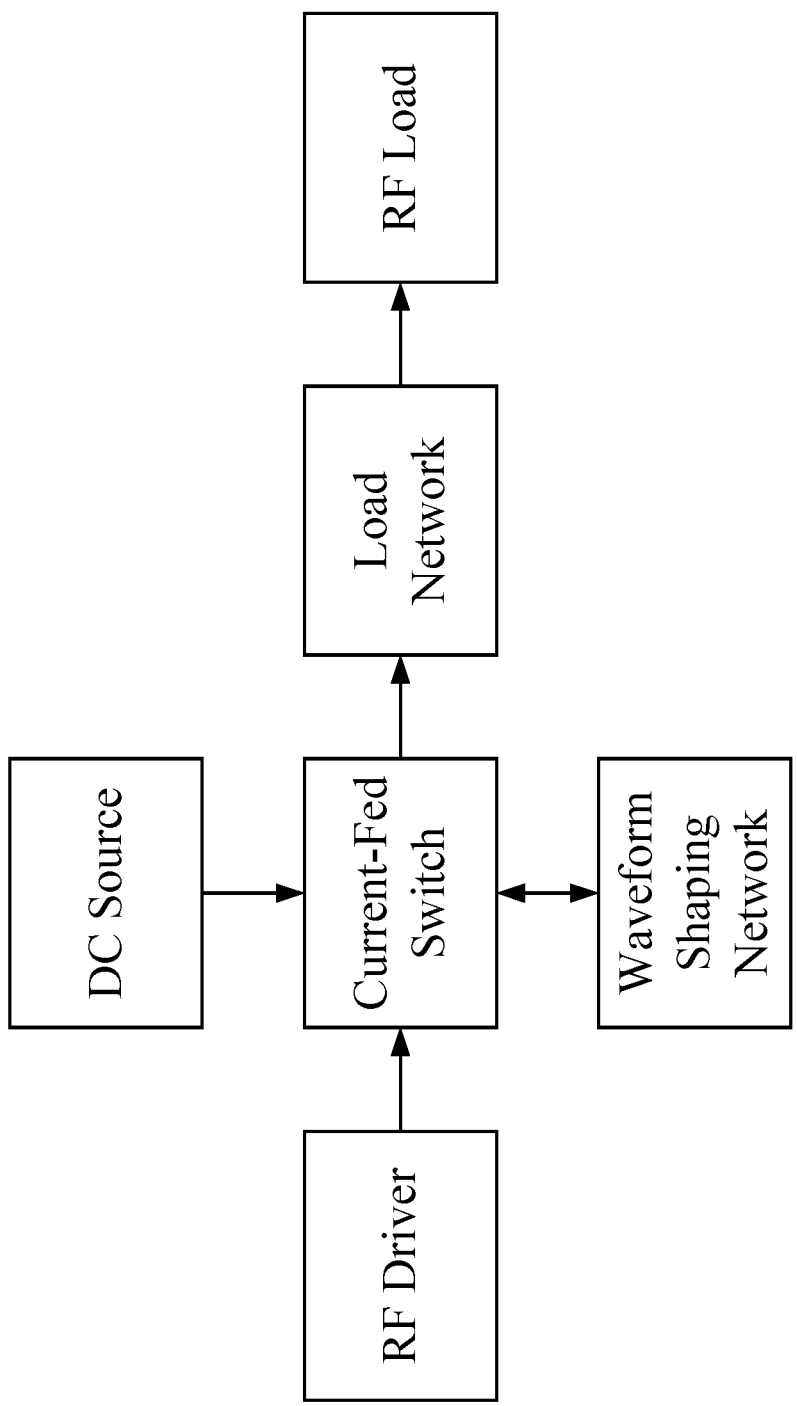
FIG. 1 is block diagram of an amplifier-based apparatus with current-fed-switch circuitry and push-pull wave-shaping circuitry, according to an example of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving devices characterized at least in part by power conversion/amplification topologies manifesting high efficiencies and high performance attributes in terms of significantly-reduced voltage stress, resistive-load independent ZVS operation, reducing the filtering for input ripple currents, significantly-reduced circulating energy and/or improved drain efficiencies. While the present disclosure is not necessarily limited to such aspects, an understanding of specific examples in the following description may be understood from discussion in such specific contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Exemplary aspects of the present disclosure are related to methods and circuit-based apparatuses involving power conversion/amplification which manifest such above attributes by use of a semiconductor device having multiple signal-amplification circuit stages and a waveform-shaping circuit shaping circuit. Among the signal-amplification circuit stages are first and second signal-amplification circuit stages which operate out of phase from one another via push-pull actions, with the first and second signal-amplification circuit stages including respective first and second switching circuits. The waveform-shaping circuit shapes, in response to each of the first and second circuit stages, a voltage signal for presentation to the first and second switching circuits.

Also in accordance with the present disclosure, certain other aspects are directed to apparatuses (e.g., systems, assemblies and/or devices) methods that involve one or more aspects of the above circuitry and, in more specific examples, also have such a waveform-shaping circuit arranged to interact between and/or intercouple energy of the first and second circuit stages, so that these stages can drive a load via terminals at each of the first and second circuit stages. Further, one or each of the first and second circuit stages may further include a single-ended inverter circuit as part of the impedance path. In certain related implementations, further specific aspects and examples may have the first and second circuit stages configured to operate out of phase from one another (e.g., by approximately 180) degrees), with the waveform-shaping circuit implemented via a capacitor or a circuit manifesting a capacitance to capacitively couple the circuit stages at respectively opposing terminals of the waveform-shaping circuit, and the waveform-shaping circuit may be configured as such to drive a load via terminals at each of the first and second circuit stages to shape signals coupling between or across the switches of each stage to optimize efficiencies. In yet other related particular examples, such embodiments include each of the first and second circuit stages having inductive elements/circuitry with inductance values that are set, to minimize or optimize for the amplifier at least one, or any combination, of circulating energy, power consumption or power loss, and/or input EMI and potential oscillations.

In further certain specific implementations according to the present disclosure, each of the first and second stages may be single-ended inverter circuits. Using such an approach, each of the single-ended inverter circuits may have first and second impedance paths being interconnected at an upper node, wherein the first impedance path includes a first inductive circuit associated with an inductance value for a signal to drive an upper terminal of the switching circuit for the single-ended inverter circuit, and the second impedance path includes a second inductive circuit associated with an inductance value for a signal to drive a lower terminal of the switching circuit for the single-ended inverter circuit.

Consistent with the above aspects, such a manufactured device or method of such manufacture may involve aspects presented and claimed in U.S. Provisional Patent Application Ser. No. 62/988,745 filed on Mar. 12, 2020 (STFD.419P1), to which priority is claimed). To the extent permitted, such subject matter is incorporated by reference in its entirety generally and to the extent that further aspects and examples (such as experimental and/more-detailed embodiments) may be useful to supplement and/or clarify. Such devices and/or methods may be used for effecting one or more of the above-noted attributes by using the inverter circuitry with first and second impedance paths respectively associated with particular first and second inductance values which are set relative to one another. For example, for increasing performance and efficiencies, it has been discovered that the first inductive circuit may be much greater (e.g., at least twice as great as, or 2×) than the second inductance value, and in other examples, the first inductive circuit may be greater than the second inductance value by other values (as examples, greater by a factor of 1.5×, 2.5×, and anywhere from 1.4× to 3×). In other examples, the relative difference (or ratio) between these inductance values may be set by starting at one of these above-mentioned relative differences and then increasing and/or decreasing the difference and monitoring the performance based, for example, on improving (e.g., minimizing or optimizing) amplification-performance parameter(s) such as circulating energy, power consumption or power loss, and/or input EMI and potential oscillations. For certain examples, methods and/or circuit (or component-value) selection of this type are contemplated as being part of the present disclosure.

In various other specific examples according to the present disclosure, aspects of the above-characterized circuitries may be an integral part of an imaging circuit such as in medical MRI (magnetic resonance imaging) equipment and systems, in vehicle communication systems (e.g., in an automobile, electric vehicle, aircraft, and/or train), and in a DC-operated machines to assemble components (e.g., robot, portable sensor/camera) such as in industrial or other environments.

Figure 2:
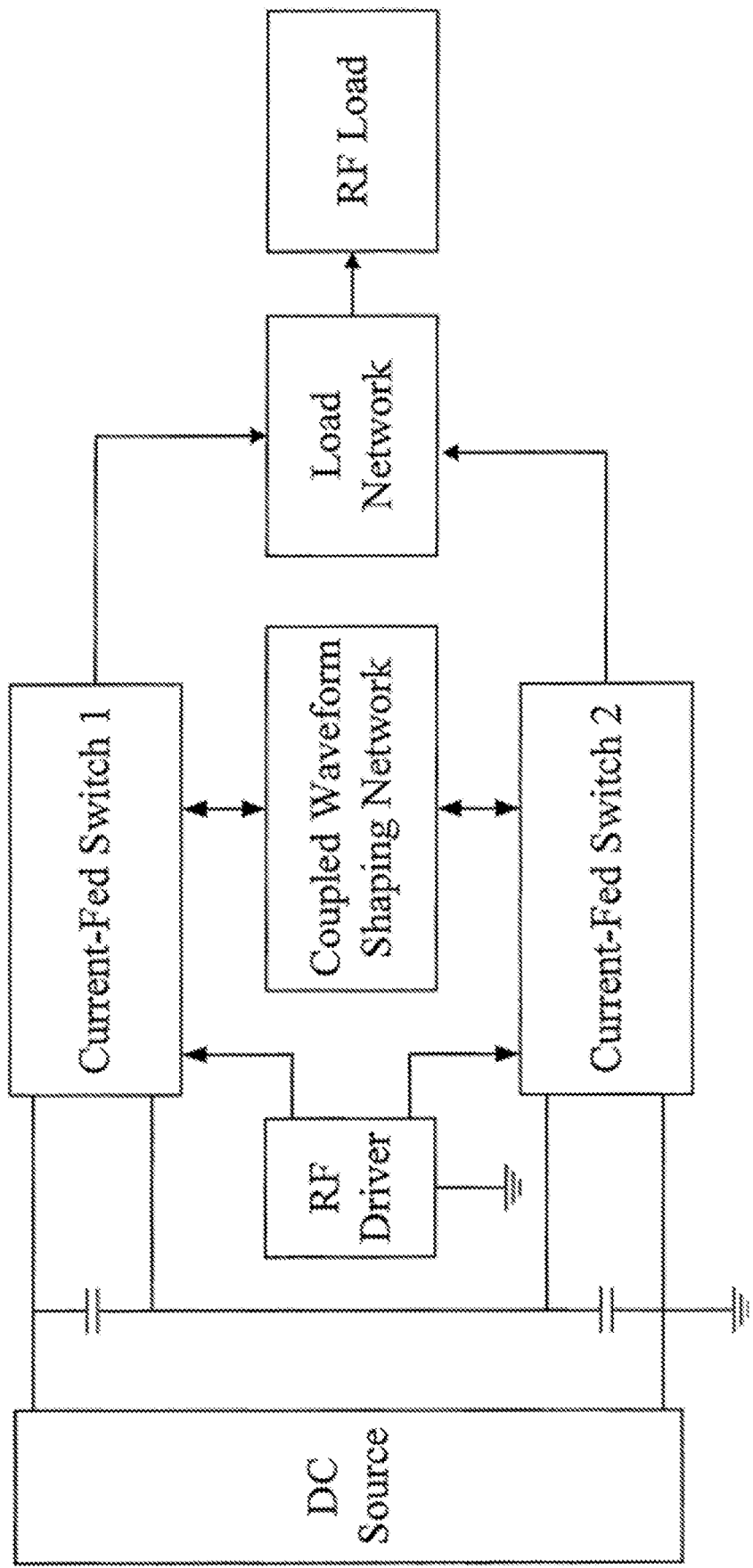
FIG. 2 is another block diagram of an amplifier-based apparatus (or circuits) with push-pull wave-shaping circuitry and multiple current-fed-switch circuits, according to an example of the present disclosure.

Consistent with the above-characterized circuitries and/or attributes of such circuitries, FIGS. 1 and 2 depict examples, in block diagram form, of apparatuses to show exemplary ways in which power amplification may be realized using a circuit having first and second circuit stages stacked and operating out of phase from one to provide a push-pull operation, with current being provided via (frequency-dependent) impedance paths in the first and second circuit stages to switching circuitry (having a plurality of switches not shown separately in FIG. 1) and in response to operation of the first and second circuit stages. In connection with the frequency-dependent impedance configuration, a (quasi-) square voltage waveform may be shaped using a circuit to adjust the LC impedance at the outputs of the switches which, in certain FET-based implementations, is the impedance seen at the drain node of each FET (field-effect transistor). This may be achieved, for example, by using impedance-affecting circuitry (e.g., capacitive ("C"), inductive ("L") and/or resistive ("R") circuitry) to shape the voltage waveform through creation of a short impedance at even harmonic frequencies, for example, 2 fs where fs is the fundamental frequency for an ideal sine wave. In such examples, such a (quasi-) square voltage waveform may be converted into a more-sinusoidal waveform in various ways including as examples (one or more of which may be combined): a capacitor or capacitive-based circuit to further smoothen (or edge taper) the corners of the (quasi-) square voltage waveform: RC-based circuitry to produce first an interim (quasi-) triangular-waveform from the (quasi-) square voltage waveform and then to convert the (quasi-) triangular-waveform to the more-sinusoidal waveform: integration circuitry such as series RC: differentiation circuitry such as series RL: more-complex and/or active/FET-based circuits (e.g., edge-based or time-triggered sinusoidal signal generators and sample-and-quantize-adjust circuits which recreate the desired more-sinusoidal waveform based on samples of the (quasi-) square voltage waveform). In one particular example, one or more of the above wave-shaping circuities is used with respective shunt-tuning legs of the switching circuitry to shunt at least one selected resonant frequency, and wherein the waveform-shaping circuit includes circuitry along a circuit path having end nodes respectively connected to the shunt-tuning legs to provide an effective block of DC current flowing through the circuit path.

More particularly, each of FIGS. 1 and 2 depicts an amplifier device including various circuitry or circuit blocks including an RF (radio frequency) driver and a DC power source as input source and at or near their outputs, a load (circuit) network and RF load. Further, each shows waveshaping circuitry for signal modification involving signal interaction between or among the current-fed switch circuitry. FIG. 2 differs from FIG. 1, for example, in that the current-fed-switch circuitry of FIG. 2, is implemented and shown via specifically-defined first and second switches and with push-pull wave-shaping circuitry affecting signal interaction between or among the first and second switches. As may be appreciated and discussed further, more than two such switches may be used to implement the current-fed switch circuitry.

Using FIG. 2 as an exemplary representative for an understanding of both FIGS. 1 and 2, a DC source is shown at the left of FIG. 2 as providing power along an upper voltage supply rail and a lower supply rail (e.g., the latter rail shown at common or ground). Also, FIG. 2 shows first and second circuit stages (current-fed switches 1 and 2) being stacked and to operate out of phase from one another to provide a push-pull operation. Each of these stages may include a switching circuit (not shown in FIG. 2) and further include an impedance path to drive the switching circuit. The switching circuit may be based on or use field-effect transistors (e.g., "FET-based" circuitry). A waveform-shaping circuit (in one implementation, e.g., being a capacitor) is used to shape, in response to each of the first and second circuit stages, a voltage signal for presentation to the switching circuits. In different embodiments, the amplifier of FIG. 2 may include load circuitry (e.g., the appliance driven the by the amplifier) and/or be used for coupling energy (e.g., wirelessly, wired or a combination thereof) to a load network which may be a more-conventional load bearing a certain connected resistance (or impedance) directly at the output nodes of the amplifier circuit, may be an RF-type load such as may be coupled wirelessly, or may be a more complex circuit such as one which effects a certain degree of impedance matching and/or circuitry which combines signals output from multiple switching circuits such as from first and second circuit stages as described above, from first, second and third circuit stages, etc.

Figure 3:
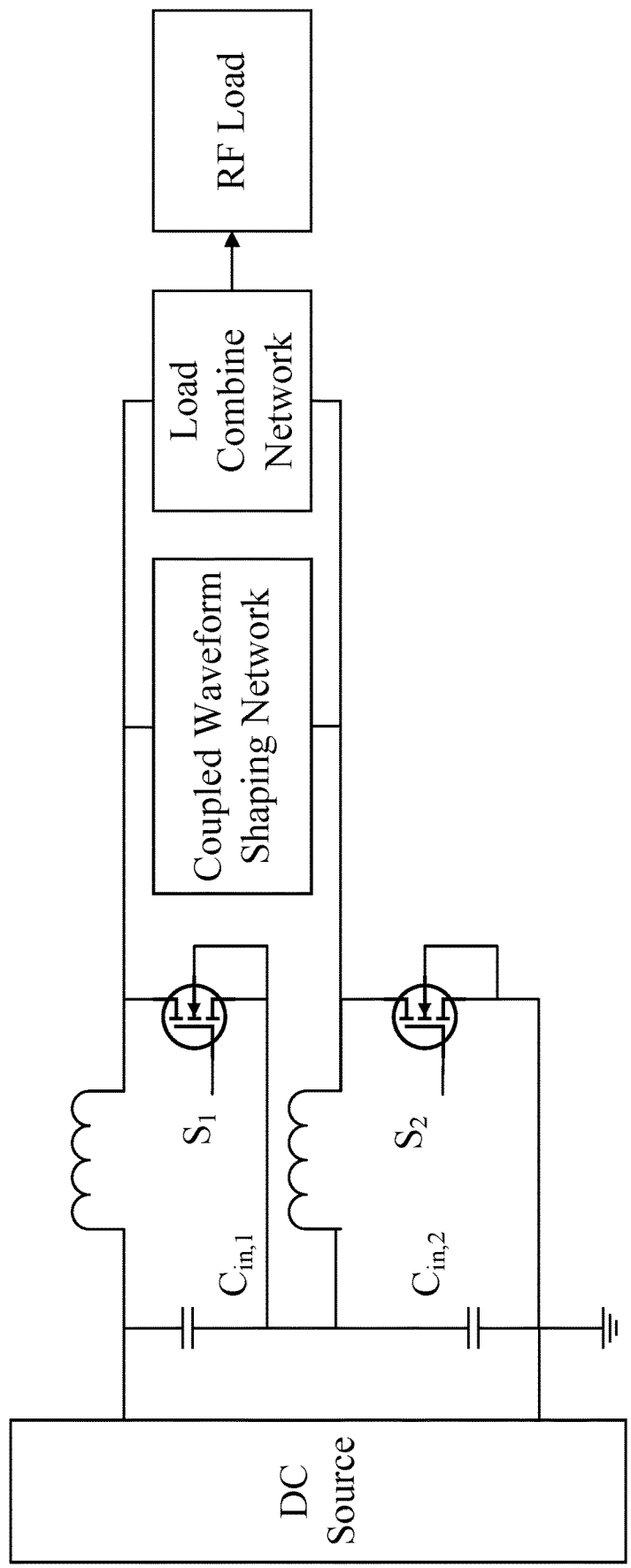
FIGS. 3-5 are other block diagrams of respective amplifier-based apparatuses with push-pull wave-shaping circuitry and multiple current-fed switches, according to further examples of the present disclosure, with FIG. 3 showing the outputs from the switches being combined at a load combining network, FIG. 4 being similar to FIG. 3 and adding a quarter-wave transmission line, and FIG. 5 showing how a few or more multiple current-fed switches may be incorporated.
Figure 4:
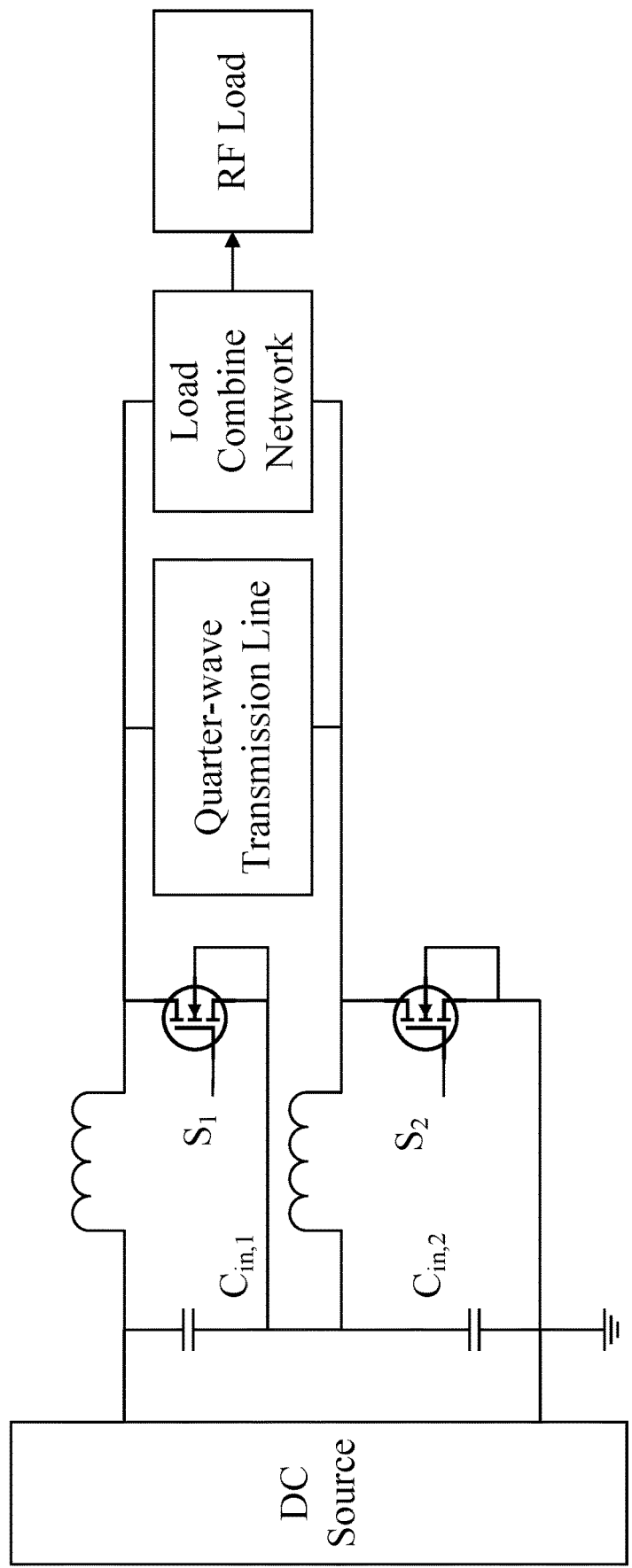
Figure 5:
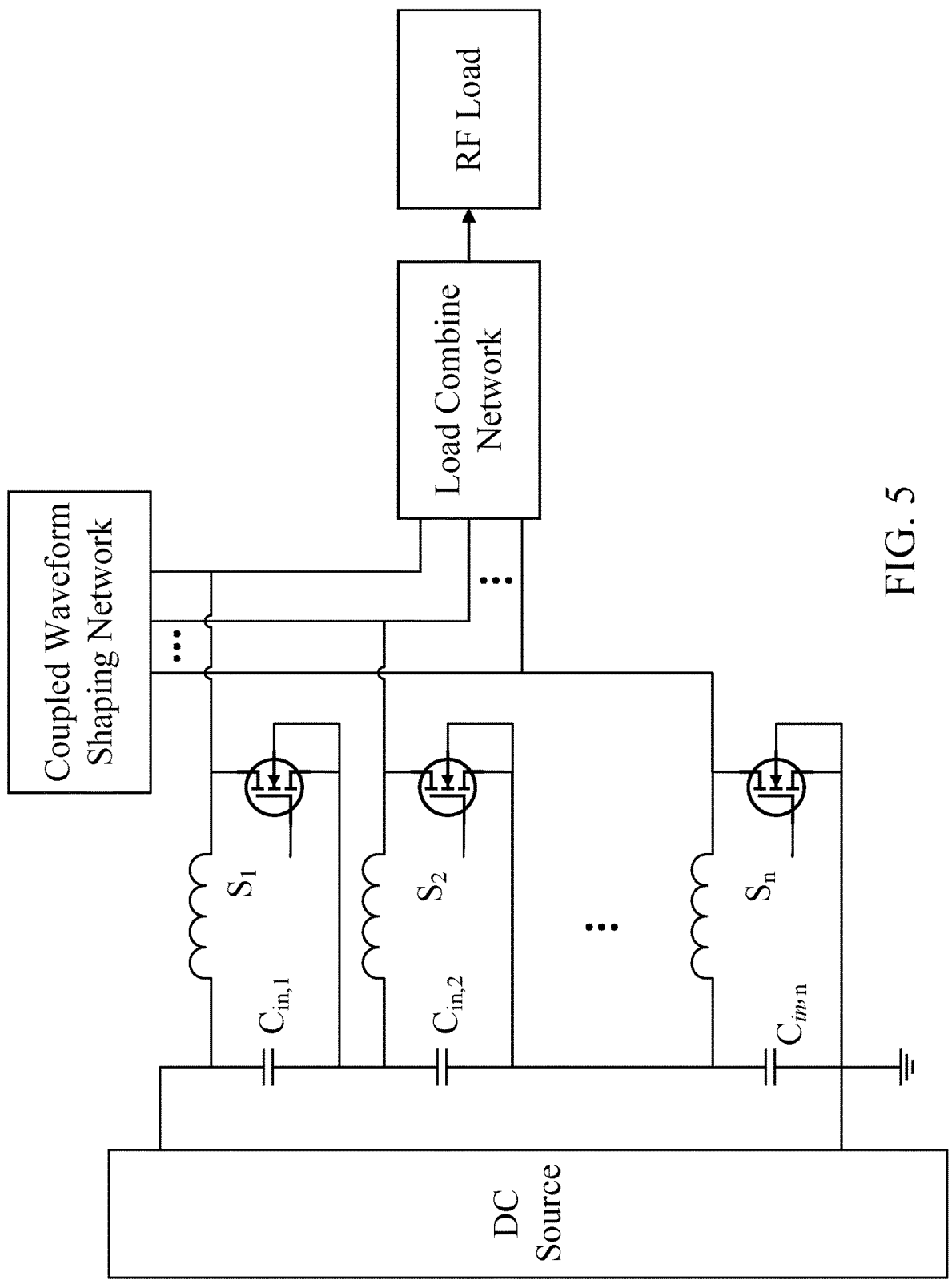

FIGS. 3-5 are other block diagrams of respective amplifier-based apparatuses with push-pull wave-shaping circuitry and multiple current-fed switches, according to further examples of the present disclosure. FIG. 3 shows the outputs from the switches being combined at a load combining network. While example applications of each of the apparatuses of FIGS. 3-5 may overlap, the example of FIG. 3 might be selected for use in connection with certain examples involving plasma drives, magnetic resonance imaging systems, wireless power transfer systems, and/or ultrasound transducer drivers.

FIG. 4 is similar to FIG. 3 and adding a quarter-wave transmission line which may be useful in example embodiments, according to the present disclosure, where the amplifier-based apparatus using a transmission line of a certain selected length (and for significantly higher switching frequencies) used as the network to effect waveform shaping. The transmission-line example of FIG. 4 might be selected for use in connection with example embodiments involving radio transmission in mobile devices, WiFi routers, and nuclear magnetic resonance spectroscopy.

FIG. 5 showing how a few or more multiple current-fed switches may be incorporated in a stacked manner. In such examples, the entire power amplification system/device can interface with a DC input voltage that is much higher than the FET's rating (e.g., at least ten percent higher and in some cases at least a magnitude of order higher). The example of FIG. 5 might be selected for use in connection with example embodiments involving high-voltage, direct current (HVDC) transmission and wind turbine systems.

Figure 6:
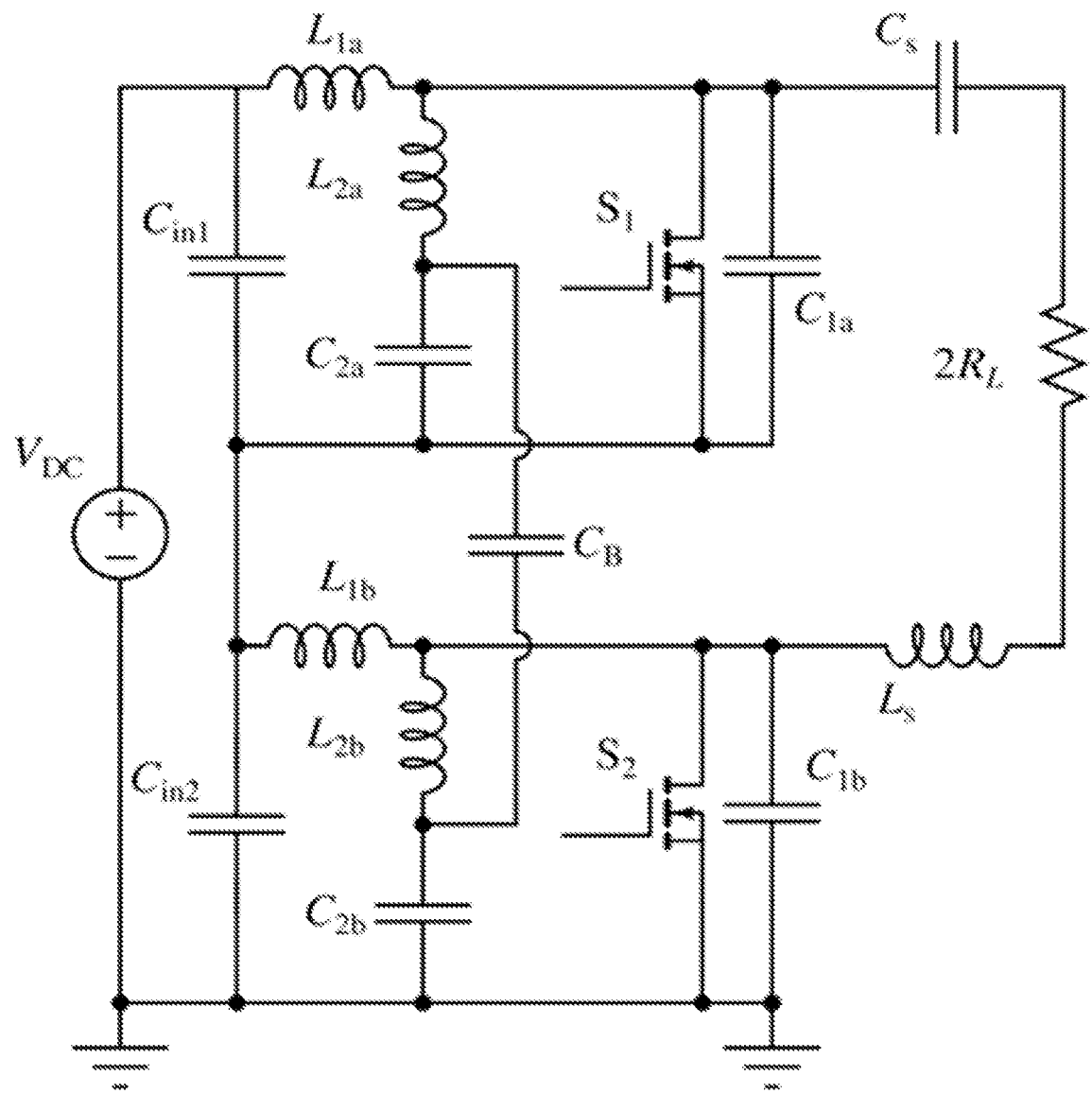
FIG. 6 is schematic diagram showing one of many specific ways for constructing an amplifier-based apparatus, according to an example of the present disclosure.
Figure 7A:
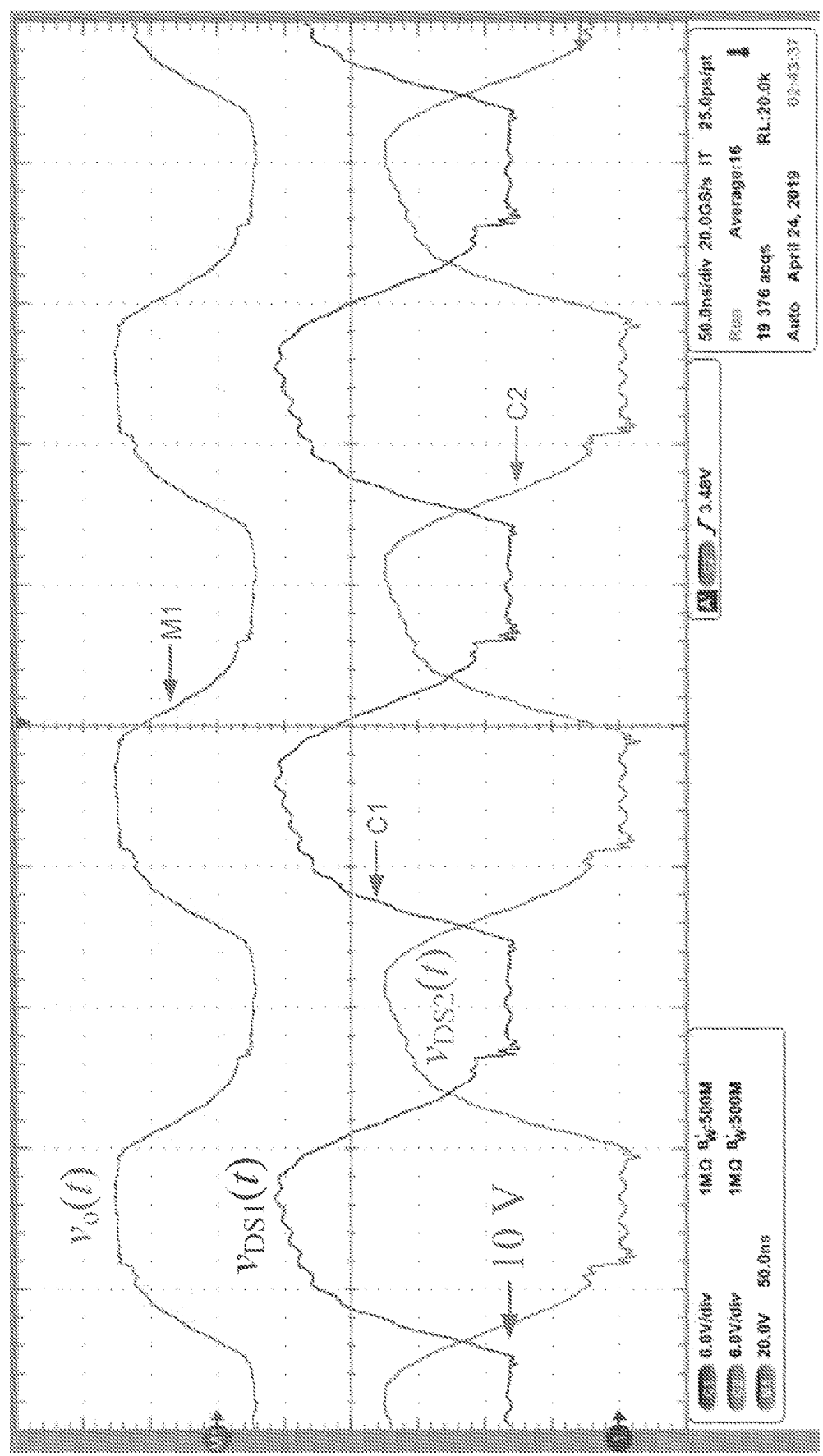
FIGS. 7A, 7B, 7C and 7D are respective graphs showing drain-to-source voltage waveforms for various DC source voltages including 20 VDC, 50 VDC, 70 VDC and 100 VDC associated with an example (experimental/proof-of-concept) embodiment of the present disclosure.
Figure 7B:
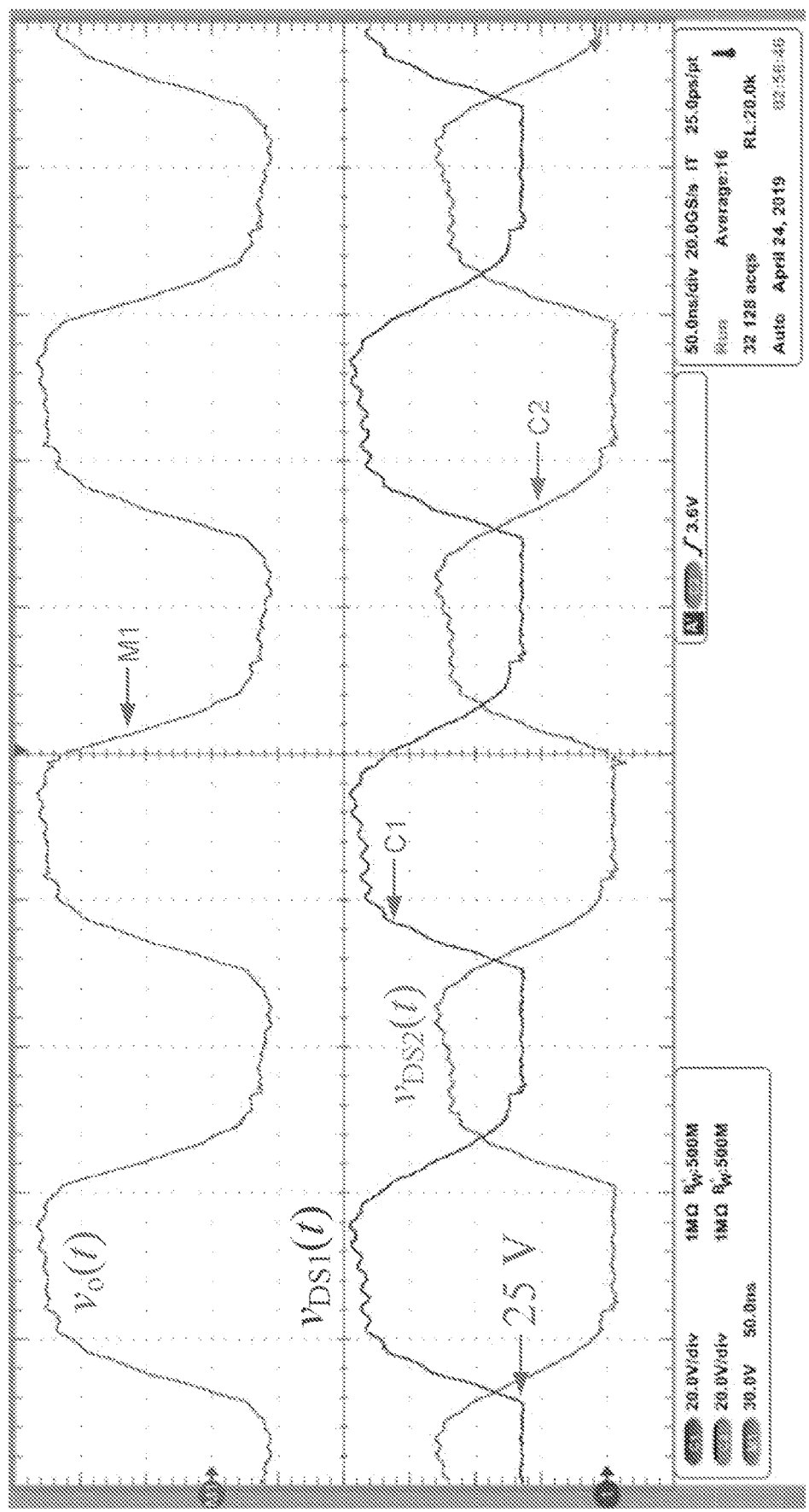
Figure 7C:
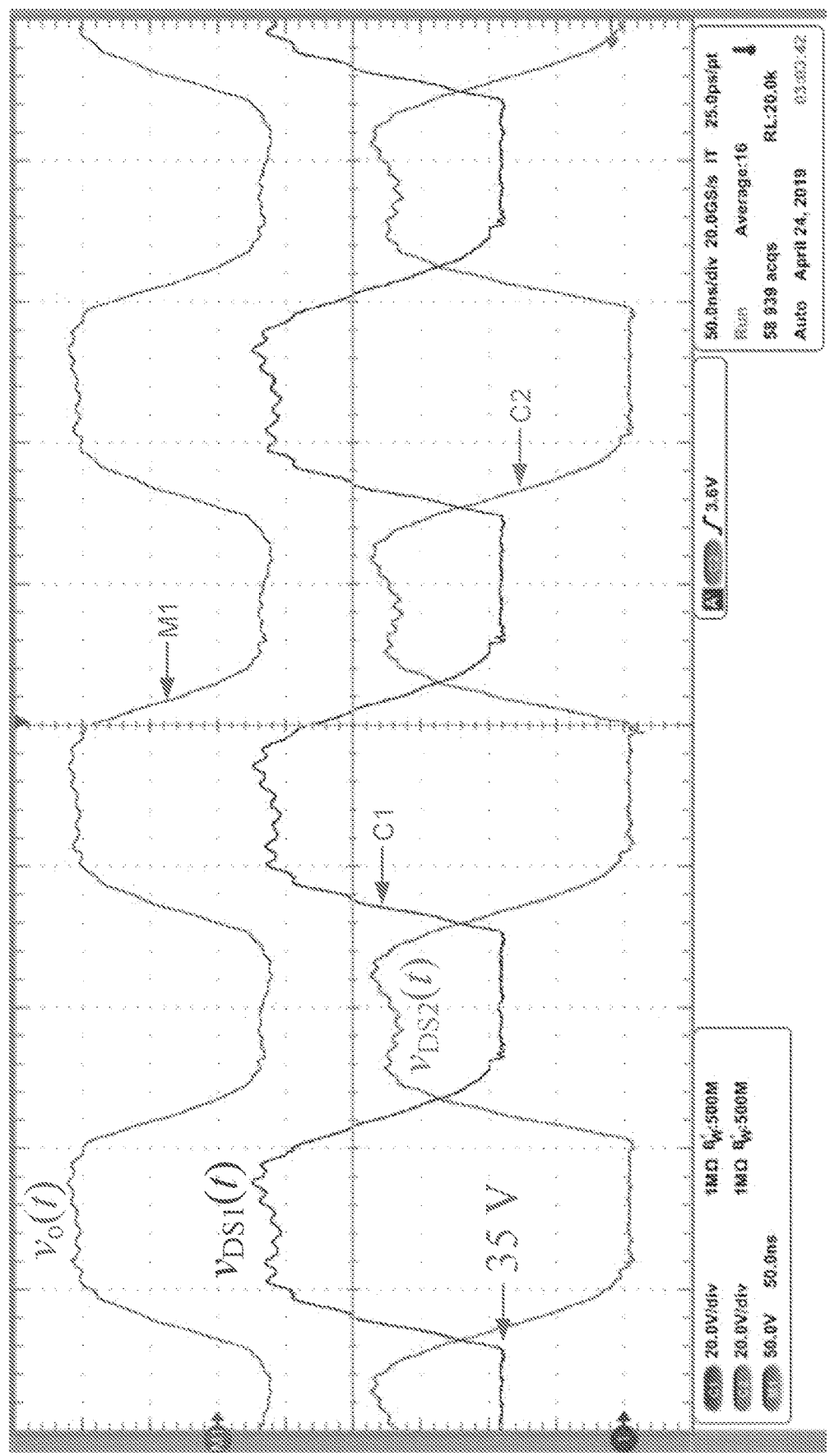
Figure 7D:
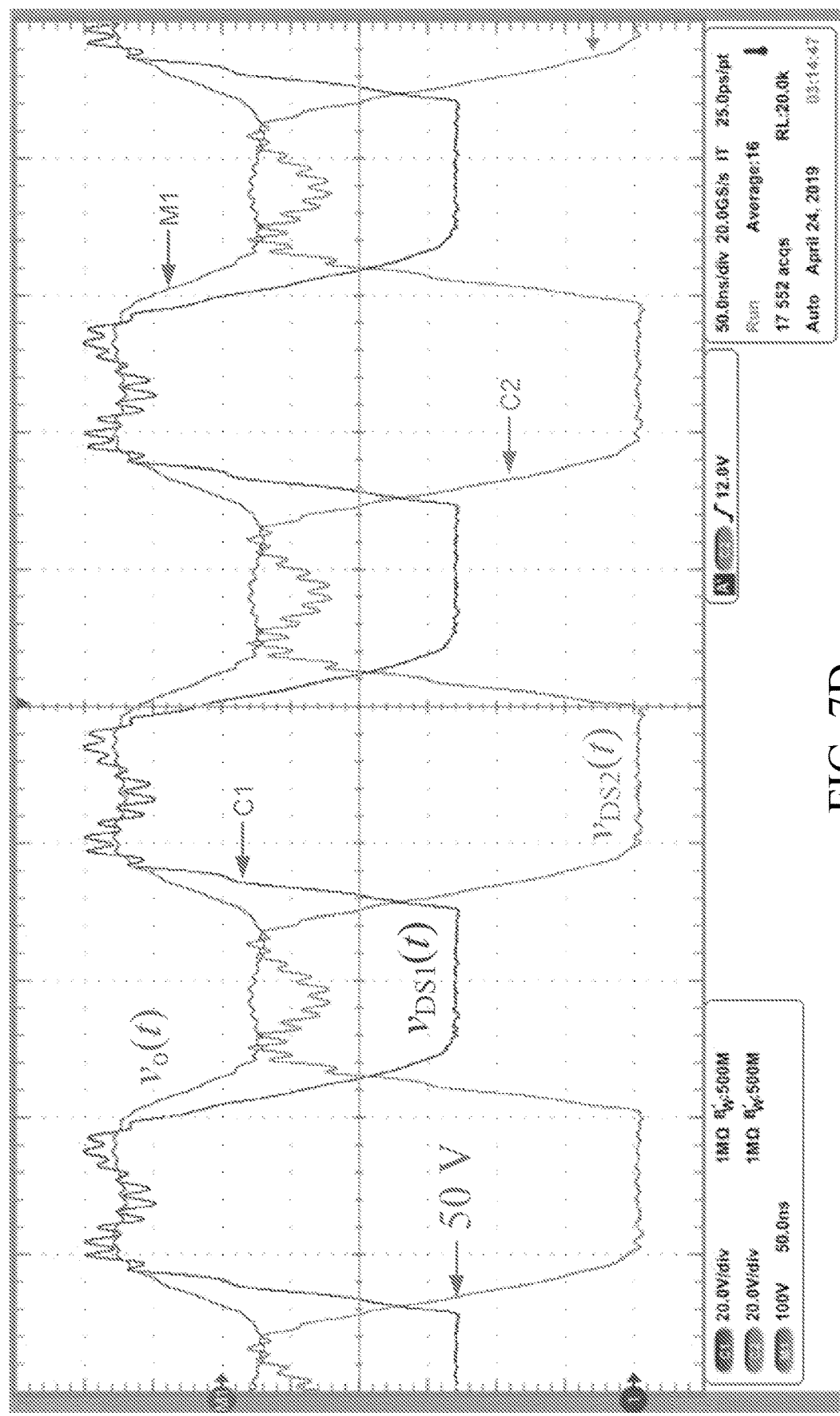

Relating to the above-discussed or illustrated approaches, FIG. 6 depicts a more specifically-illustrated diagram (similar/related aspects of which are described in connection with FIG. 13 of Appendix A of the underlying U.S. provisional application) to show yet a further example in which power amplification may be realized according to the present disclosure. In such a circuit, by using a stacked (or multi-level) structure and by actively shaping the voltage waveform through a short impedance path (e.g., via the inductors illustrated in FIG. 6), the switch voltage may reduce stress in such an amplifier. In this example shown in FIG. 6, two stacked single-phase amplifiers have two phases operating in an interleaving manner. The amplifier-based apparatus exemplified in such illustrations may further include such an RF driver configured as being coupled to the gate node and the source node of a FET in an upper one of the stacked (or multi-level) switches and with the source node set at a constant voltage during operation.

In certain other examples, the disclosed type of amplifier apparatus may provide or be part of a system in which there is wireless coupling between the load network (or the network with 2RL in series with Ls at right side of FIG. 6) and the RF load. Such wireless charging circuits may be for or part of phones, laptops, watches, TVs, electric vehicles, etc.

In further specific examples, the disclosed type of amplifier apparatus may provide or be part of a system in which there is (nonwireless) output coupling to the load. Examples include but are not limited to plasma loads, MRI resonators, antenna for cellphones or base stations, transformed-isolated dc-dc power converters, etc.

The following "push-pull" discussion may be helpful background for a better understanding of the two phases operating in the example circuit of FIG. 6. A push-pull amplifier typically connects the de input of two identical amplifiers in parallel and the ac load differentially between the switch nodes. By operating the two amplifiers 180 degrees shifted, the DC input current ripples are significantly reduced and shifted to two times the switching frequency. In a T-network consisting of symmetric differential-mode impedance ZD/2 and common-mode conductance YC, different impedance can be created for a push-pull amplifier at odd and even harmonic frequencies. In a push-pull amplifier, the drain-voltage waveforms may be shifted by half a switching cycle 0.5 Ts apart, which can be expressed as, $V_{DS2}(t)=V_{DS1}(\omega S(t-0.5\ Ts))$, $\omega s=2\pi fs$, where fs and Ts are respectively the switching frequency and the period of the signal(s) driving the switch(es).

For analysis of the type of circuitry disclosed herein in connection with the present invention, the voltage waveforms may decomposed into different harmonic components, thereby yielding the relationships:

$$v_{DS1}(t) = V_{DC} + \sum_{n=1}^{\infty} V_{DS,n}\cos(n\omega St - \varphi_n),$$

$$v_{DS2}(t) = V_{DC} + \sum_{n=1}^{\infty} V_{DS,n}\cos(n\omega St - n\pi - \varphi_n),$$

This time shift will cause different phase shifts between the harmonic components of $v_{DS}1(t)$ and $v_{DS}2(t)$. For the odd harmonics at frequencies of $(2k+1)fS$, the phase shift is $(2k+1)\pi$ degrees, k=0, 1, 2 . . . , respectively. Due to symmetry, the midpoint between the two drain nodes is clamped to zero potential and a virtual ground for odd harmonics. The effective impedance seen by each MOSFET is only ZD/2 at frequencies of $(2k+1)fS$, k=0, 1, 2 . . . . Conversely, for the even harmonics at each frequency of 2 kfS, the phase shift between the two drain nodes is $2k\pi$ degrees, k=1, 2 . . . , respectively. Consequently, the even-mode harmonic voltages are always in phase and the midpoint has the same potential as each drain node. The midpoint becomes a virtual open circuit for even harmonics. Effectively, the common-mode conductance YC can be divided into two halves and connected to each side separately. At even harmonic frequencies of 2 fs, k=1, 2 . . . , the effective impedance seen by each MOSFET is ZD/2 in series with YC/2. Therefore, the same T network creates different impedance across the switches' drain nodes at odd and even harmonic frequencies.

By actively shaping the voltage waveform through creating a short impedance at $2\ f_s$, we can reduce the switch voltage stress in such an amplifier to around 2.1 VDC, which is much smaller than the 3.6 $VD_{DC}$ case as in known Class E inverters. One way to further reduce this voltage stress is to use a stacked structure, as shown in FIG. 6. A series-stacked or multi-level structure as known in switched-capacitor converters, allows the usage of low voltage-rated semiconductor devices with better performance metrics.

FIG. 6 includes a push-pull T-network (PPT) structure using two stacked single-phase amplifiers according to aspects of the present disclosure. $C_{in1}$ and $C_{in2}$ are connected in series, and each capacitor has a dc voltage of 0.5 VDC. The two phases still operate with interleaving. The DC voltage on $C_{in1}$ and $C_{in2}$ self-balance at 0.5 VDC as long as $C_{in1}$ and $C_{in2}$ are large-value and have small ac impedance. To achieve the same T-network as the non-stacked case at ac, we insert a de block capacitor $C_B$ between the two shunt tuning legs. $C_B$ withstands a DC voltage of 0.5 VDC and is effectively a short impedance at high frequency. As $C_{in2}$ is also a short impedance at high frequency, $C_{2a}$ and $C_{2b}$ are effectively in parallel at ac. The design analysis discussed previously in connection with push-pull amplifiers also applies to the example series-stacked PPT converter type illustrated in the present disclosure, provided that the effective input voltage is 0.5 VDC.

The input series-stacked PPT amplifier in FIG. 6 brings multiple advantages in applications requiring high voltage and high-frequency RF amplification. Firstly, the peak voltage stress on $S_1$ and $S_2$ (switches 1 and 2) is reduced to 1.05 VDC, much smaller than the 2.1 $V_{DC}$ in a non-stacked type of design and 3.6 $V_{DC}$ in a Class E type design. Lower voltage stress allows the use of devices with better performance metrics and could reduce the devices' conduction losses. As is known, the unit area on-resistance $R_{on,sp}$ of a high-voltage Si Power MOSFET scales roughly with the power of 2.5 of the breakdown voltage VBV, $$R_{on,sp} \propto V_{BV}.$$

With the power constant and the voltage scaled by half, the conduction losses scales by:

$$I^2 R_{on}|2\,V_{DC} \to 0.71^2\,R_{on}|V_{DC}.$$

With the same device area but half of the voltage stress, conduction losses can be reduced by 30%.

The series-stacked circuit of FIG. 6 may be compared to a typical circuit and waveform associated with a Class D amplifier with ZVS and ZDS operation. The Class D amplifier's upper of the two-phase-drive switches (or amplifiers) needing to be driven by a floating signal, which can be challenging to implement under high-voltage, high-frequency conditions. This common-mode requirement often limits the maximum achievable frequency and/or power for Class D amplifiers. Only requiring a dc level-shifted gating signal makes a series-stacked PPT amplifier according to the present disclosure a more viable design choice for high-voltage, high-frequency RF amplification. Also, compared with a half-bridge-based Class D amplifier, the series-stacked PPT Φ2 converter has the same peak voltage stress. Although this series-stacked PPT Φ2 converter also uses two switches, the top switch S1 only needs to be driven by a dc level-shifted gating signal.

Further, a series-stacked PPT amplifier according to the present disclosure may provide for a higher gain from the DC input to the AC output than a Class D amplifier. The series-stacked PPT amplifier according to the present disclosure may have a DC-AC gain of 0.5×2.43=1.215, while a Class D circuit has a maximum DC-AC gain of 2/π=0.64.

For the series-stacked circuit of FIG. 6, the input current ripple could be non-trivial and depends on the inductance of $L_{1a}$ and $L_{1b}$ and the ratio of $C_{in2}/C_{in1}$. When selecting the input inductance in the series-stacked PPT Φ2 amplifier, $L_1$ is normalized as $L_1=kL_2$, where $L_1$ is the inductance of $L_{1a}$ and $L_{1b}$, $L_2$ is the inductance of $L_{2a}$ and $L_{2b}$, and define, $n=C_{in2}\,C_{in1}$, then the input current ripple $\Delta_{iDC}$ is minimized when $$n_{opt}=2k-(k-2)/(k+2).$$

More Detailed Experimental and/or Proof-of-Concept Examples

Various experimental examples, some of which are discussed below, have demonstrated that the above-characterized aspects, structures and methodologies may be used in one or more semiconductor devices to form semiconductor circuits and devices including but not limited to a variety of circuit-based devices benefiting from high-efficiency high-power circuits. The following experimental examples are presented as being non-limiting to facilitate a better understanding of certain aspects of the present disclosure.

FIGS. 7A, 7B, 7C and 7D are respective graphs showing drain-to-source voltage waveforms for various DC source voltages including 20 $V_{DC}$, 50 $V_{DC}$, 70 $V_{DC}$ and 100 $V_{DC}$, according to aspects of the present disclosure. More specifically, these graphs shows oscilloscope waveforms of the drain voltage across the two MOSFETs, in an example amplifier-based apparatus implemented according the above-discussed type of push-pull amplifier design such as in connection with FIGS. 1, 2 and 6. For example, in an experimental/proof-of-concept prototype and consistent with aspects of the present disclosure, the design specifications include: Input voltage VDC 100 Volts, Frequency $f_S$ 6.78 Megahertz, and output power $P_o$ 320 Watts.

For such a design as in FIGS. 1, 2, 6, etc., with a series-stacked input according to examples of the present disclosure, the effective input voltage may be 0.5 $V_{DC}$ (50 V), and for such a push-pull circuit, the total input power may be 2 $P_{DC}$. Assuming ideally a 100% DC-AC efficiency, PDC is 160 W. The required load resistance per phase may be calculated as RL=0.74×50²/160 Ω=11.6Ω. For more detailed implementations in such an exemplary prototype as exemplified in connection with FIG. 6, calculated values of all the components may be calculated from the following component-calculation equations: RL=0.74 ($V^2_{DC}/P_{DC}$): α=0.13×2π=0.8168 rads: L2=0.94 (RL/ωS): C2=1/4$ω_s^2$ L2; and C1=0.61/ωsRL. Approximations may be made during derivations, e.g., the component values being calculated using the above equations do not guarantee a direct ZVDS operation, but generally ensure ZVS operation of the switches S1 and S2. The values of C1 may be modified slightly to achieve ZVDS operation, and a larger L2 will result in a smaller inductive current $i_{odd}$, which makes achieving ZVS more difficult. In contrast, increasing L2 reduces the circulating energy and conduction losses. Similarly, smaller C1 values tend towards ZVS operation at the expense of larger voltage ringing on the switch during the off-time.

Most available high-power RF resistors have values of 50Ω or 100Ω, so for convenience, we use a total load resistance of 25Ω instead of 23.2Ω, as 25Ω can be implemented by arranging multiple RF resistors in parallel. In this example, we select an input inductor L1 as 5 times L2, so Cin2 should be roughly 9.6 times of Cin1 using the above relationship for minimizing the input current ripple. By selecting a quality factor Qs of 1.85 in the loading circuit, the values of Ls and Cs can be calculated. Calculated values of all the components in such detailed implementations (e.g., the noted example prototype) may be obtained using the above component-calculation equations. As examples, component and/or values in such a prototype may be as follows:

| Device Symbol | Component Description |
|---|---|
| S1, S2 | Infineon BSC160N15NS5 150 V Si |
| Gate drive | Texas Instruments LM5114 |
| $C_{in1}$ | 0.1 µF C0G ceramic |
| $C_{in2}$ | 1 µF C0G ceramic |
| $C_B$ | 0.2 µF C0G ceramic |

| Device Symbol | Calculated | Implementation |
|---|---|---|
| 2$R_L$ | 23.2Ω | 25Ω, arrays of RP60975R0100JNBK |
| $L_{1a}, L_{1b}$ | 1.53 µH | 1.46 µH, Fair-rite 67 EEQ20/9, 18AWG 4 turns, 0.15 mm gap |
| $L_{2a}, L_{2b}$ | 305 nH | 297 nH, Fair-rite 67 EEQ20/9, 12AWG |

| | | |
|---|---|---|
| Ls | 1 μH<br>Qs = 1.85 | 2 turns, 0.4 mm gap<br>1.1 μH, Fair-rite 67<br>EEQ20/13, 14AWG 5<br>turns, 1.2 mm gap |
| Cs | 550 pF | C0G ceramic, 200 V |
| C2a, C2b | 451 pF | C0G ceramic, 500 V |
| C1a, C1b | 1.16 nF | S1 Coss + 630 pF, C0G<br>ceramic, 500 V |

According to the present disclosure, with such an example prototype under test, the load resistance may be kept constant and the input voltage varied. Further, across the input voltage range 0-100 V, the DC voltage on Cin1 and Cin2 is stable at 0.5 VDC. To help the start-up transient, a surface-mount R2010 resistor is added in parallel to both Cin1 and Cin2. Both resistors are 400 kΩ, so the dc voltage divider ratio is 0.5. At low input voltage (<60 V), S1 and S2 only achieve partial ZVS due to the non-linearity of Coss, where the effective Coss increases with lower applied voltage VDS. At higher voltage (≥60 V), S1 and S2 achieve full ZVS. Similarly because of this non-linearity, Coss can become an order of magnitude larger as the bias voltage reaches zero than that biased under high voltage, so S1 and S2 can achieve close-to ZDS operation, as shown in the FIGS. 7C and 7D.

Figure 8:
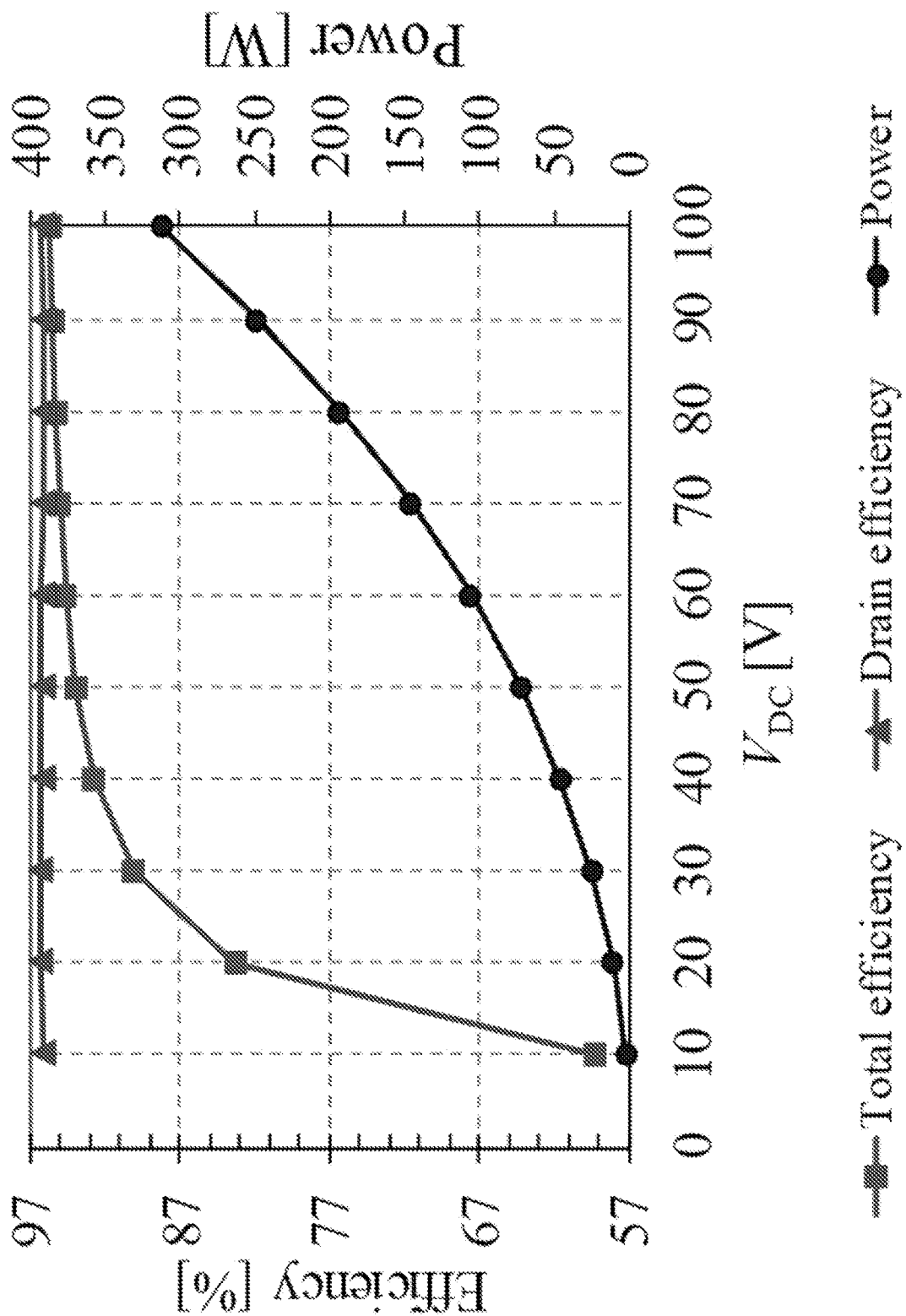
FIG. 8 is a graph showing plots of efficiency versus input voltage associated with an example (experimental/proof-of-concept) embodiment of the present disclosure.

In assessing thermal conditions for this type of design prototype, thermal imaging is obtained at steady-state operation at full power. Using a thermal camera such as FLIR A655sc, this type of design prototype demonstrated a maximum temperature on the MOSFET case as 41.7° C. in thermal steady-state, and the average case temperature of the MOSFET is 38° C., FIG. 8 is a graph showing plots of efficiency versus input voltage associated with an example amplifier-based apparatus highlighting aspects of the present disclosure. For example, again using the above type of example (experimental/proof-of-concept) prototype consistent with aspects of the present disclosure, the drain efficiency curve is flat and above 96% across the entire input voltage range. With external 630 pF ceramic capacitors parallel to the MOSFET, the non-linearity of the junction capacitance Coss is mitigated, flattening the drain efficiency curve. This flat efficiency curve benefits applications using amplitude modulation like envelope tracking power amplifiers. Even including the gate driving losses of the Si MOSFETs, the total efficiency remains above 90% from 30 VDC to 100 VDC, which corresponds to an output power from 25 W to 312 W. The peak efficiency of the prototype is 95.7% at 100 V input and 312 W output.

Figure 9A:
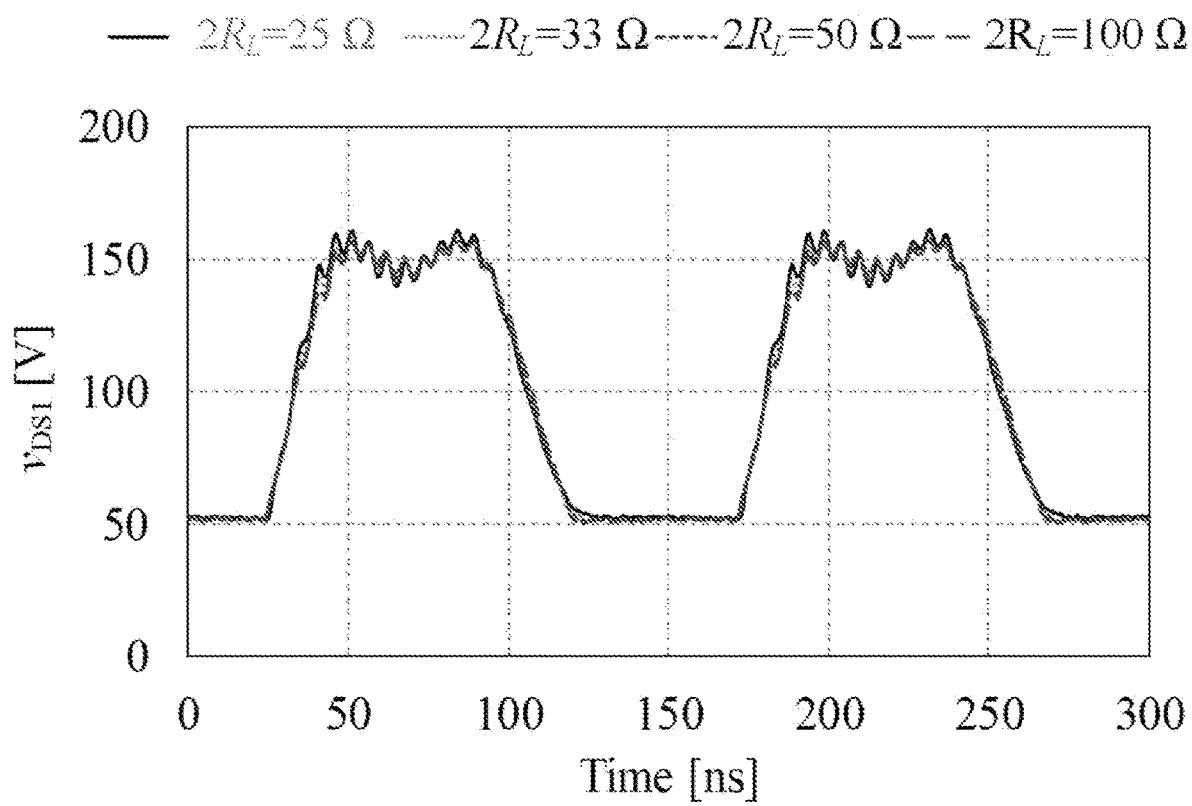
FIGS. 9A and 9B are respective graphs showing drain voltage and output current waveforms manifested by an example amplifier-based apparatus under different or variable resistive loads, also according to exemplary aspects and associated with an example (experimental/proof-of-concept) embodiment of the present disclosure.
Figure 9B:
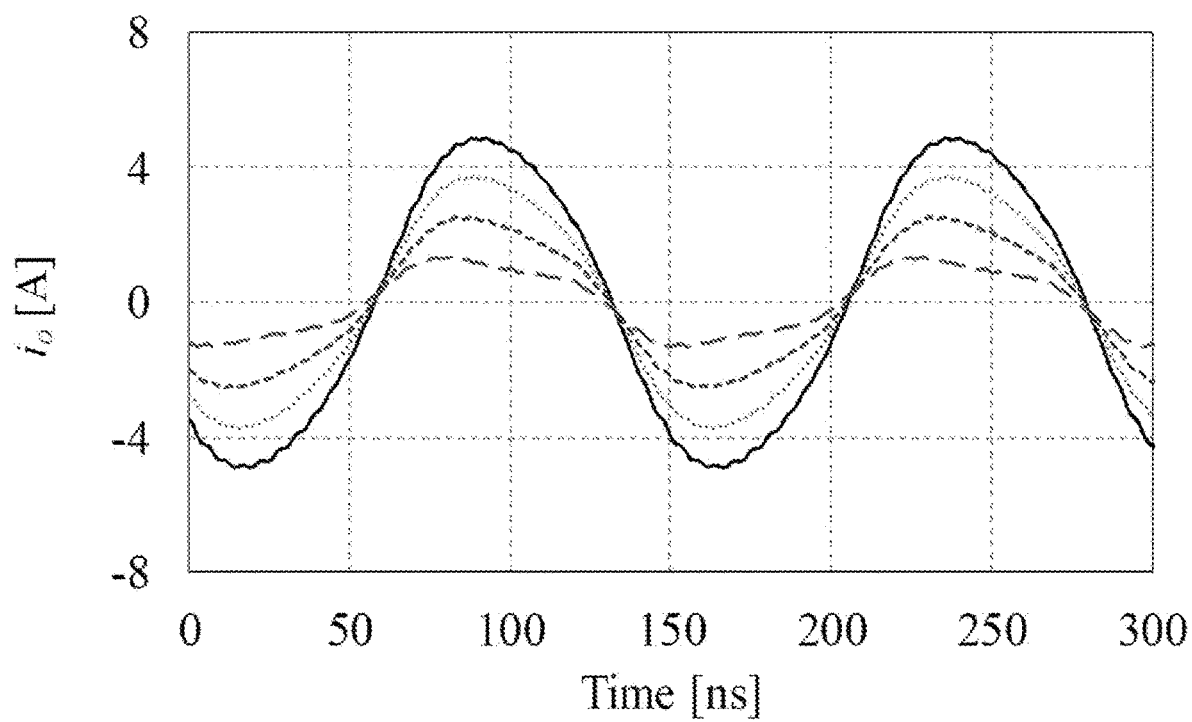

FIGS. 9A and 9B are respective graphs showing drain voltage and output current waveforms manifested by an example amplifier-based apparatus under different or variable resistive loads. For example, again using the above type of example (experimental/proof-of-concept) prototype consistent with aspects of the present disclosure, to verify the load-independent operation, the prototype may be tested under variable output power. Keeping the input voltage constant at 100 V and varying the load resistance, the prototype is tested at 25%, 50%, 75%, and 100% power. FIGS. 9A and 9B shows the oscilloscope waveforms of the drain voltage and output current. The switch voltage vDS1(t) is almost the same and shows ZVS operation, while the load current io(t) varies by four times. The measured waveforms FIG. 9A (showing approximately overlapping plots) and FIG. 9B match well with waveforms obtained during (e.g., LTSPICE) simulations in which this type of amplifier design is tested under varying load resistance with the output power set to be 100%, 60%, and 20% of the nominal value. Under different power, the drain-to-source voltage vDS1(t) still maintains ZVS but loses ZVDS operation at light load levels. As the power decreases, the switch current waveform iS1(t) shifts downwards. The loss of ZVDS operation at light load is because the switch current is a negative value instead of zero at the moment of turn-on. The output voltage o(t) is almost constant, while the output current io(t) varies from nominal load level to 20% of the load.

Figure 10:
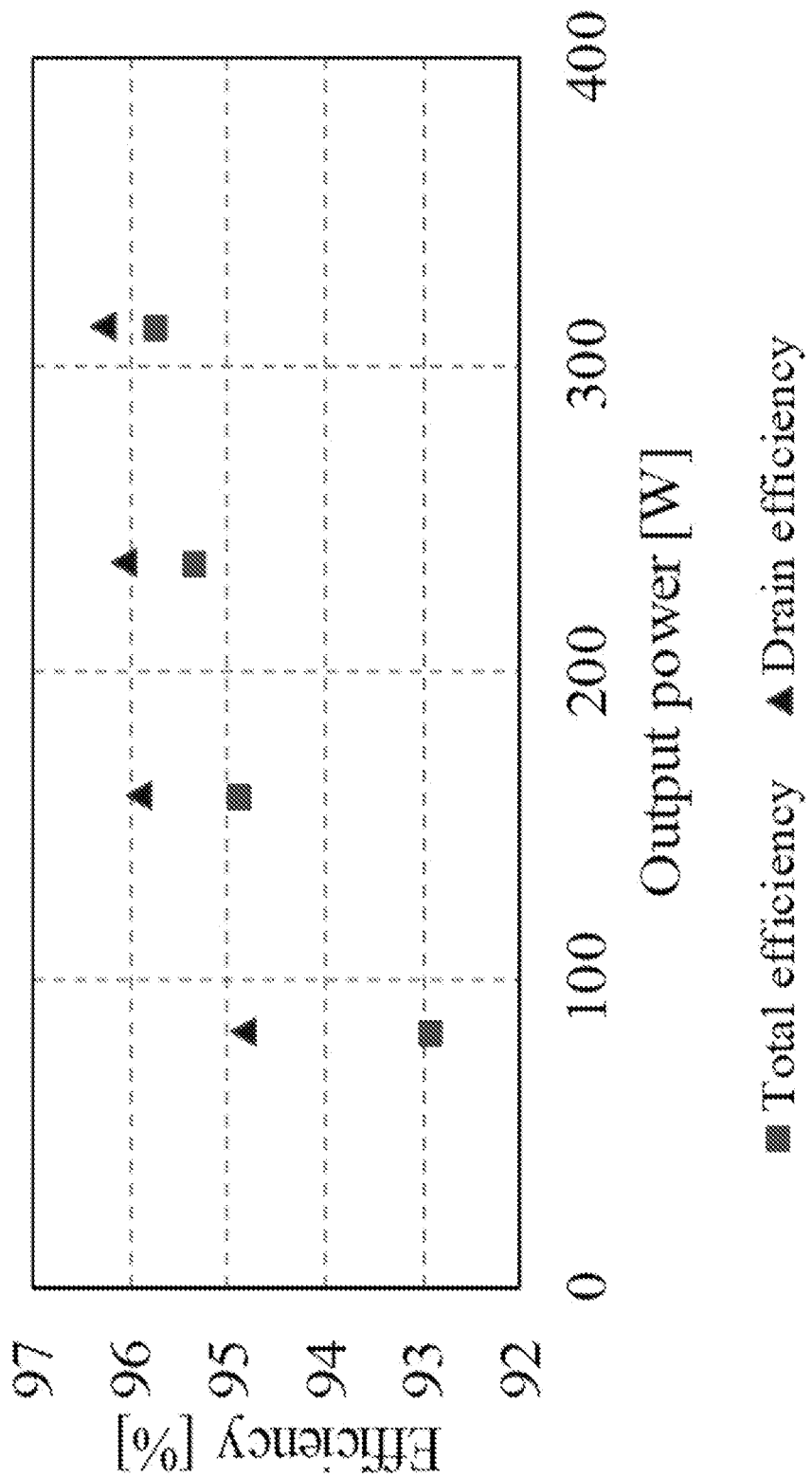
FIG. 10 is a graph showing plots of efficiency versus output power of an example amplifier-based apparatus, also according to exemplary aspects and associated with an example (experimental/proof-of-concept) embodiment of the present disclosure.

FIG. 10 is a graph showing plots of efficiency versus output power of an example amplifier-based apparatus with the x-axis plotting different output powers, according to the above type of example (experimental/proof-of-concept) prototype. Across 25%-100% power range, the drain efficiency remains above 94.5%, and the total efficiency remains above 93% (e.g., using a Pearson 2878 current probe, which has a 30 Hz-70 MHz 3 dB bandwidth and a +1/−0% accuracy, to measure the output power). For varying the load, an array of RF resistors may be used, along with a water cooling system to keep the temperature of these loads constant during testing.

Such a series-stacked push-pull T-type converter performs remarkably well compared to known HF Class EF and E/F circuits. For example, with a 1.05 times normalized voltage stress, this prototype permits for use of a low-cost 150 V $S_1$ MOSFET for an input voltage of 100 V, which is in contrast to other types of Class EF or E/F family harmonic-tuned amplifiers for which semiconductor devices with much higher voltage ratings than the DC input are required. At high frequencies, wide-bandgap (WBG) power semiconductors, for example, GaN (Gallium Nitride) and SiC (Silicon carbide), are preferred choices due to the low gate driving power. Using the T-network as part of this type of design, circulating energy is significantly reduced, which makes for an easier-to-design amplifier with high efficiency. Further, this type of series-stacked PPT amplifier design achieves some of the highest reported levels of peak efficiency, even with low-cost Si devices such as noted above.

Accordingly, a variety of different processes and devices may be advantaged by such aspects disclosed in connection with the present disclosure, including aspects and examples in the above-identified U.S. Provisional Application (STFD.419P1).

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices and examples as described hereinabove may also be found in the Appendices of the above-referenced U.S. Provisional Application.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as layers, blocks, modules, device, system, unit, controller, and/or other circuit-type depictions. Also, in connection with such descriptions, the term "source" may refer to source and/or drain interchangeably in the case of a transistor structure. Such semiconductor and/or semiconductive materials (including portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed:

1. An apparatus comprising:
   first and second circuit stages configured to operate out of phase from one another and via a push-pull operation;
   first and second switching circuits respectively in the first and second circuit stages; and
   a waveform-shaping circuit to shape, in response to each of the first and second circuit stages, by tapering transitions of a voltage signal for presentation to the first and second switching circuits.

2. The apparatus of claim 1, further including a first inductive impedance path connected to one of two terminals across which the first switching circuit is to switch, and a second inductive impedance path connected to one of two terminals across which the second switching circuit is to switch, wherein the voltage signal is to be presented at the first and second inductive impedance paths to reduce stress experienced by the first and second switching circuits via the tapering of transitions of the voltage signal.

3. The apparatus of claim 1, wherein the first and second circuit stages include respective shunt-tuning legs to shunt at least one selected resonant frequency, and wherein the waveform-shaping circuit includes circuitry along a circuit path having end nodes respectively connected to the shunt-tuning legs to provide an effective block of DC current flowing through the circuit path.

4. The apparatus of claim 1, wherein the first and second circuit stages are stacked, with each of the first and second circuit stages being coupled to a common DC voltage source and having an effective DC input voltage which is dependent on a DC level provided by the common DC voltage source.

5. The apparatus of claim 4, wherein each of the first and second circuit stages has an effective DC input voltage set at one half of the DC level provided by the common DC voltage source.

6. The apparatus of claim 1, wherein the first and second circuit stages are stacked relative to one another and the waveform-shaping circuit is connected to the first and second circuit stages and to effect a short circuit therebetween at high frequencies associated with harmonics caused by operation of the first and second circuit stages.

7. The apparatus of claim 1, wherein each of the first and second circuit stages includes:
   an impedance path having a switch-driving branch to present current to the switching circuit of said each of the first and second circuit stages and having another branch to couple energy to another of the first and second circuit stages via the waveform-shaping circuit; and an output port to couple to a load circuit.

8. The apparatus of claim 7, wherein the output port of the first circuit stage is coupled to the first switching circuit via a first LC-based circuit, and an output port of the second circuit stage is coupled to the second switching circuit via a second LC-based circuit which complements the first LC-based circuit, and wherein the first LC-based circuit and the second LC-based circuit are to couple to the load circuit to form a series RLC-based circuit, wherein the load circuit shares in a resistance contribution to the RLC-based circuit that is dominated by the load circuit.

9. The apparatus of claim 8, wherein the output ports are to provide a differential signal capable of driving the load circuit.

10. The apparatus of claim 1, further including a load circuit, wherein each of the first and second circuit stages includes an output port to couple to the load circuit.

11. The apparatus of claim 1, further including an oscillating- or frequency-signal driver circuitry to drive each of the switching circuits at its gate or control node, so that each of the switching circuits is out of phase relative to a phase of another of said each of the switching circuits.

12. The apparatus of claim 11, wherein the respective switching circuits of the first and second circuit stages are to operate out of phase from one another by approximately 180 degrees.

13. The apparatus of claim 1, wherein each of the respective first and second circuit stages further includes a single-ended inverter circuit, including a field-effect transistor, as part of an impedance path configured to present current to the respective one of the first and second switching circuits.

14. The apparatus of claim 1, wherein the waveform-shaping circuit has a frequency-dependent inductor-capacitor impedance configuration and includes a first terminal coupled to the first switching circuit and includes a second opposing terminal coupled to the second switching circuit.

15. The apparatus of claim 1, wherein the first and second switching circuits are respectively coupled to first and second impedance paths, the first and second impedance paths being respectively associated with first and second inductance values, and wherein the first inductive value is at least twice as great as the second inductance value, and wherein the first and second circuit stages form an amplifier to manifest certain performance as a function of the first and second inductance values.

16. The apparatus of claim 15, wherein said first and second inductance values are set for the amplifier to, minimize or optimize at least one of or a combination from among the following: circulating energy, power consumption or power loss, and input EMI and potential oscillations.

17. The apparatus of claim 1, wherein the first and second switching circuits are respectively coupled to first and second impedance paths, the first and second impedance paths being respectively associated with first and second inductance values, and wherein the first inductive value is greater than the second inductance value by a factor in a range from three times (3×) to five times (5×) the second inductance value.

18. The apparatus of claim 1, wherein at least one of the first and second switching circuits includes a GaN-based (Gallium Nitride) field-effect transistor.

19. The apparatus of claim 1, wherein neither of the first and second switching circuits includes a GaN-based (Gallium Nitride) field-effect transistor.

20. The apparatus of claim 1, wherein the waveform-shaping circuit is part of an amplifier and the amplifier is to provide a power efficiency of at least 88%.

21. The apparatus of claim 1, wherein the waveform-shaping circuit is part of an amplifier and the amplifier is to provide a power efficiency of at least 80%; and less than 95%.

22. The apparatus of claim 1, wherein the first and second circuit stages and the waveform-shaping circuit are to drive a load wirelessly at a frequency greater than or equal to 1 Megahertz.

23. The apparatus of claim 1, wherein the first and second circuit stages and the waveform-shaping circuit are to drive a load wirelessly at a frequency corresponding to approximately 6.78 Megahertz or a multiple of approximately 6.78 Megahertz.

24. The apparatus of claim 1, wherein at least one of the first and second switching circuits includes a field effect transistor (FET), and a source/drain node of the FET is to be set at a constant voltage level.

25. The apparatus of claim 1, wherein the first and second circuit stages and the waveform-shaping circuit are to drive a load wirelessly, and the load includes or corresponds to an appliance which is one of: a biomedical implant circuit; a medical MRI (magnetic resonance imaging circuit); a circuit to operate a vehicle (e.g., automobile, aircraft, train); and a DC-operated machine to assemble components (e.g., robot, portable sensor/camera).

26. An apparatus comprising:
a first circuit stage and a second circuit stage, the first circuit stage to operate out of phase from the second circuit stage and via a push-pull operation;
each of the first and second circuit stages having a respective front-end power or voltage section which is stacked in series relative to the other of the first and second circuit stages; and
a waveform-shaping circuit to shape, in response to each of the first and second circuit stages, by tapering transitions of a voltage signal for presentation to first and second switching circuits.

27. The apparatus of claim 1, wherein the respective phases of the first circuit stage and the second circuit stage interleave, and wherein each of the respective front-end power or voltage sections sets or provides a DC voltage operating level, wherein the DC voltage operating levels are approximately equal.

28. A method comprising:
operating first and second signal-amplification circuit stages out of phase from one another and via a push-pull operation, wherein the first and second signal-amplification circuit stages including respective first and second switching circuits; and
a waveform-shaping circuit shaping, in response to each of the first and second circuit stages, by tapering transitions of a voltage signal for presentation to the first and second switching circuits.

* * * * *